(12) United States Patent
Do et al.

(10) Patent No.: US 9,368,423 B2
(45) Date of Patent: Jun. 14, 2016

(54) SEMICONDUCTOR DEVICE AND METHOD OF USING SUBSTRATE WITH CONDUCTIVE POSTS AND PROTECTIVE LAYERS TO FORM EMBEDDED SENSOR DIE PACKAGE

(71) Applicant: STATS ChipPAC, Ltd., Singapore (SG)

(72) Inventors: Byung Tai Do, Singapore (SG); Arnel Trasporto, Singapore (SG); Linda Pei Ee Chua, Singapore (SG); Asri Yusof, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 13/930,980

(22) Filed: Jun. 28, 2013

(65) Prior Publication Data

US 2015/0001707 A1    Jan. 1, 2015

(51) Int. Cl.
*H01L 23/52*    (2006.01)
*H01L 21/50*    (2006.01)
(Continued)

(52) U.S. Cl.
CPC ........ *H01L 23/3121* (2013.01); *H01L 21/4832* (2013.01); *H01L 21/568* (2013.01); *H01L 23/49582* (2013.01); *H01L 24/97* (2013.01); H01L 24/06 (2013.01); H01L 24/32 (2013.01); H01L 24/48 (2013.01); H01L 24/49 (2013.01); H01L 24/83 (2013.01); H01L 24/85 (2013.01); H01L 24/92 (2013.01); *H01L 2224/04042* (2013.01); *H01L 2224/06135* (2013.01); *H01L 2224/32245* (2013.01); *H01L 2224/48091* (2013.01); *H01L 2224/48247* (2013.01); *H01L 2224/49433* (2013.01); *H01L 2224/83191* (2013.01); *H01L 2224/8592* (2013.01); *H01L 2224/85411* (2013.01); *H01L 2224/85424* (2013.01); *H01L 2224/85439* (2013.01); *H01L 2224/85444* (2013.01); *H01L 2224/85447* (2013.01); *H01L 2224/85455* (2013.01); *H01L 2224/92247* (2013.01); *H01L 2224/94* (2013.01); *H01L 2224/97* (2013.01); *H01L 2924/01322* (2013.01); *H01L 2924/12041* (2013.01); *H01L2924/12042* (2013.01); *H01L 2924/12043* (2013.01); *H01L 2924/13091* (2013.01); *H01L 2924/15153* (2013.01); *H01L 2924/15311* (2013.01); *H01L 2924/181* (2013.01); *H01L 2924/1815* (2013.01)

(58) Field of Classification Search
CPC ... H01L 24/81; H01L 23/49816; H01L 24/11; H01L 24/13; H01L 21/563
USPC .......................................... 257/737; 438/124
See application file for complete search history.

(56) References Cited

U.S. PATENT DOCUMENTS

| | | | |
|---|---|---|---|
| 5,622,873 A | 4/1997 | Kim et al. | |
| 6,407,381 B1 * | 6/2002 | Glenn | ................. H01L 31/0203 250/208.1 |

(Continued)

*Primary Examiner* — Luan C Thai
(74) *Attorney, Agent, or Firm* — Robert D. Atkins; Patent Law Group: Atkins and Associates, P.C.

(57) ABSTRACT

A semiconductor device has a substrate including a base and a plurality of conductive posts extending from the base. A semiconductor die is disposed on a surface of the base between the conductive posts. An interconnect structure is formed over the semiconductor die and conductive posts. An adhesive layer is disposed over the semiconductor die. A conductive layer is disposed over the adhesive layer. An encapsulant is deposited over the semiconductor die and around the conductive posts. One or more conductive posts are electrically isolated from the substrate. The conductive layer is a removable or sacrificial cap layer. The substrate includes a wafer-shape, panel, or singulated form. The semiconductor die is disposed below a height of the conductive posts. An interconnect structure is formed over the semiconductor die, encapsulant, and conductive posts.

34 Claims, 14 Drawing Sheets

(51) Int. Cl.
*H01L 23/31* (2006.01)
*H01L 23/495* (2006.01)
*H01L 21/48* (2006.01)
*H01L 21/56* (2006.01)
*H01L 23/00* (2006.01)

(56) References Cited

U.S. PATENT DOCUMENTS

| | | | |
|---|---|---|---|
| 6,667,543 B1 | 12/2003 | Chow et al. | |
| 6,905,910 B1* | 6/2005 | Shiu et al. | 438/106 |
| 7,183,589 B2* | 2/2007 | Kameyama et al. | 257/100 |
| 7,816,750 B2* | 10/2010 | Chua | 257/433 |
| 7,939,901 B2 | 5/2011 | Minamio et al. | |
| 7,998,781 B2* | 8/2011 | Uchida et al. | 438/66 |
| 8,492,883 B2* | 7/2013 | Chien et al. | 257/676 |
| 8,502,363 B2* | 8/2013 | Chiang et al. | 257/676 |
| 8,674,487 B2* | 3/2014 | Yu et al. | 257/676 |
| 2006/0003483 A1* | 1/2006 | Wolff et al. | 438/65 |
| 2010/0044843 A1* | 2/2010 | Chang Chien et al. | 257/676 |
| 2010/0258934 A1* | 10/2010 | Chang Chien et al. | 257/690 |
| 2011/0140263 A1* | 6/2011 | Camacho et al. | 257/692 |
| 2011/0215449 A1* | 9/2011 | Camacho et al. | 257/659 |

* cited by examiner

SEMICONDUCTOR DEVICE AND METHOD OF USING SUBSTRATE WITH CONDUCTIVE POSTS AND PROTECTIVE LAYERS TO FORM EMBEDDED SENSOR DIE PACKAGE

FIELD OF THE INVENTION

The present invention relates in general to semiconductor devices and, more particularly, to a semiconductor device and method involving a substrate including a base, conductive posts extending from the base, and protective layers disposed over the base in order to form an embedded sensor die package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A semiconductor die has an active surface containing analog or digital circuits implemented as active devices, passive devices, conductive layers, and dielectric layers formed within the die and electrically interconnected according to the electrical design and function of the die. The active surface performs the electrical and mechanical design function of the semiconductor die. The active surface may also contain a sensor such as a photodiode, phototransistor, Hall effect device, piezoelectric device, nanoelectronic device, an area sensor, swipe sensor, and microelectromechanical device. The active surface responds to stimuli such as light, sound, heat, electromagnetic radiation, electric fields, magnetic fields, motion, ionizing radiation, vibration, motion, acceleration, rotation, pressure, and temperature to enable the semiconductor die to perform design functions. For example, an optical sensor on the active surface reacts to light which passes through an opening or window in the semiconductor package to reach the sensor.

Sensors offer strong advantages such as providing high image quality, programmable pixel elements, and gray scale values from every single pixel element. Sensors may be protected from or exposed to the environment in a sensor package. In either case, due to the sensitive nature of sensor components, sensor packaging requires precise manufacturing methods in order to ensure the operability of sensors on the die during packaging.

SUMMARY OF THE INVENTION

A need exists for a semiconductor package to embed and protect semiconductor die while ensuring the operability of sensors formed on the die. Accordingly, in one embodiment, the present invention is a method of making a semiconductor device comprising the steps of providing a substrate including a base and a plurality of conductive posts extending from the base, disposing a semiconductor die over the base between the conductive posts, forming an interconnect structure over the semiconductor die and conductive posts, disposing an adhesive layer over the semiconductor die, disposing a conductive layer over the adhesive layer, and depositing an encapsulant over the semiconductor die and around the conductive posts.

In another embodiment, the present invention is a method of making a semiconductor device comprising the steps of providing a substrate including a plurality of conductive posts, disposing a semiconductor die between the conductive posts, forming an interconnect structure over the semiconductor die and conductive posts, and disposing an adhesive layer over the semiconductor die.

In another embodiment, the present invention is a semiconductor device comprising a substrate including a plurality of conductive posts, a semiconductor die disposed between the conductive posts, an interconnect structure formed over the semiconductor die and conductive posts, and an adhesive layer disposed over the semiconductor die.

In another embodiment, the present invention is a semiconductor device comprising a substrate including a plurality of conductive posts, a semiconductor die disposed between the conductive posts, and an interconnect structure formed over the semiconductor die and conductive posts.

DETAILED DESCRIPTION OF THE DRAWINGS

Figure 1:
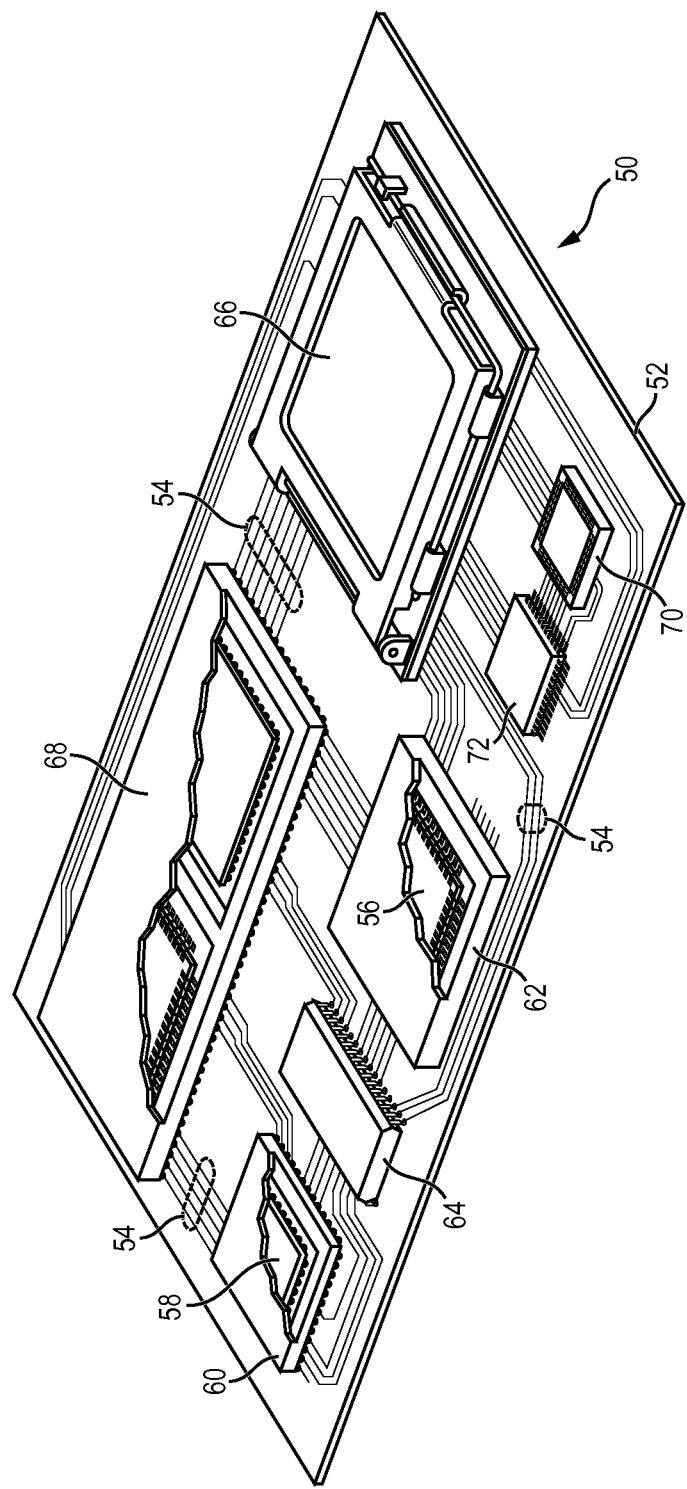
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
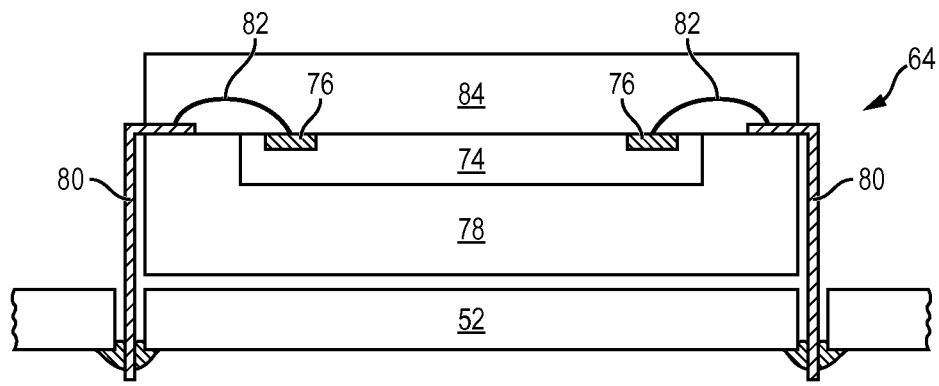
FIGS. 2a-2c illustrate further detail of the representative semiconductor packages mounted to the PCB.
Figure 2B:
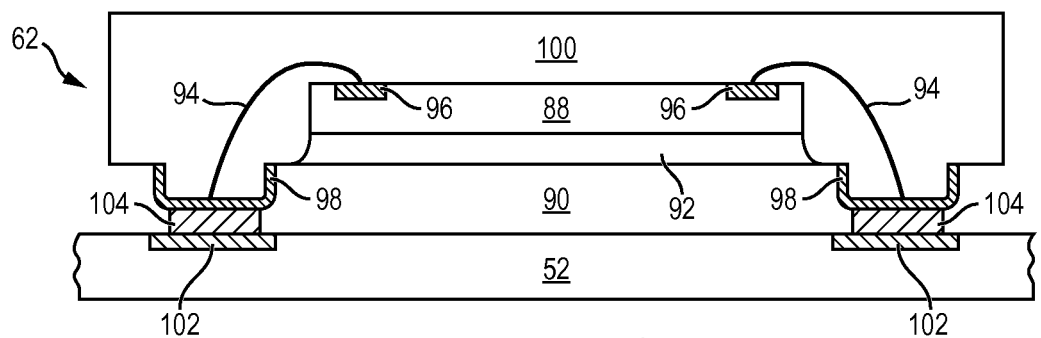
Figure 2C:
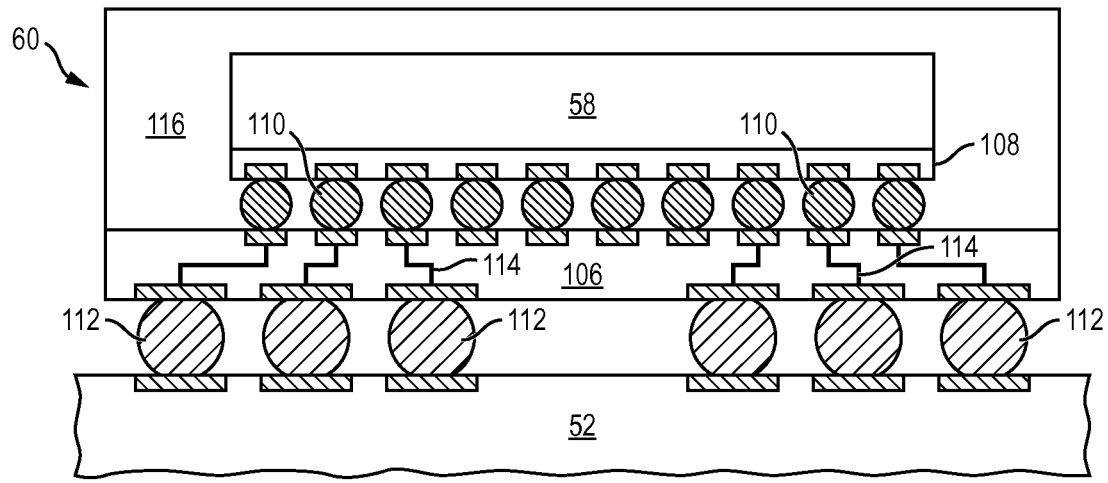

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
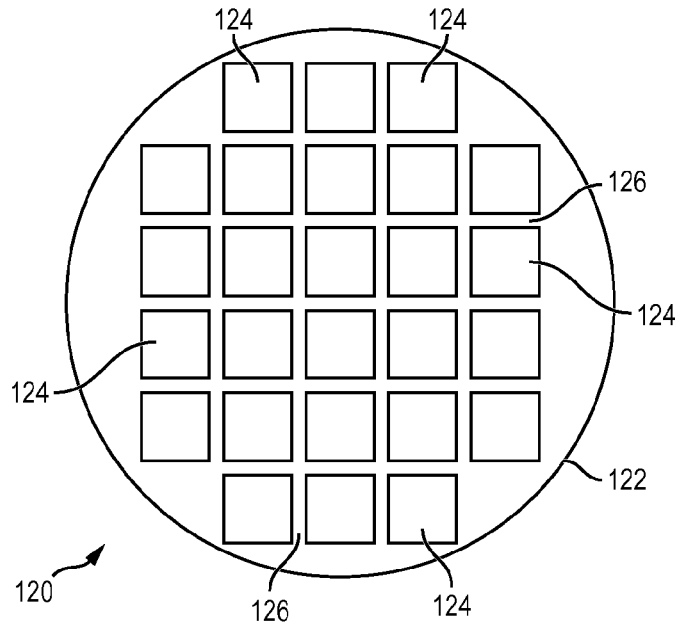
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
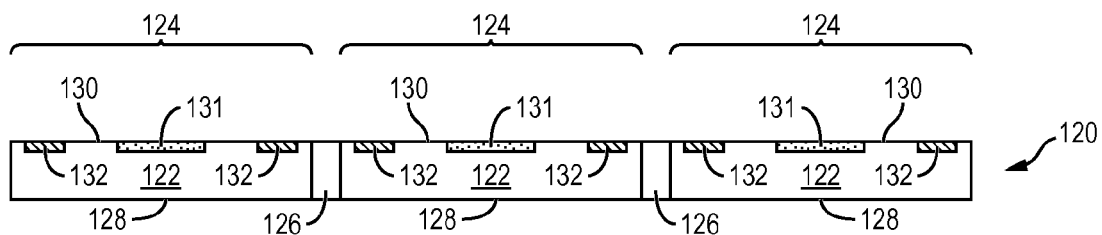

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

Each semiconductor die 124 has a sensor area 131 formed over active surface 130. Sensor area 131 may comprise a photodiode, phototransistor, Hall effect device, piezoelectric device, nanoelectronic device, an area sensor, swipe sensor, and microelectromechanical device. Sensor area 131 responds to stimuli such as light, sound, heat, electromagnetic radiation, electric fields, magnetic fields, motion, ionizing radiation, vibration, motion, acceleration, rotation, pressure, and temperature to enable semiconductor die 124 to perform design functions. In some embodiments, semiconductor die 124 with sensor area 131 contain small capacitive plates, each with their own electrical circuit embedded in the die. Sensor area 131 may occupy a portion of active surface 130 as depicted in FIG. 3b, or may alternatively occupy the entire active surface 130. In some embodiments, sensor area 131 may be formed over back surface 128.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Figure 3C:
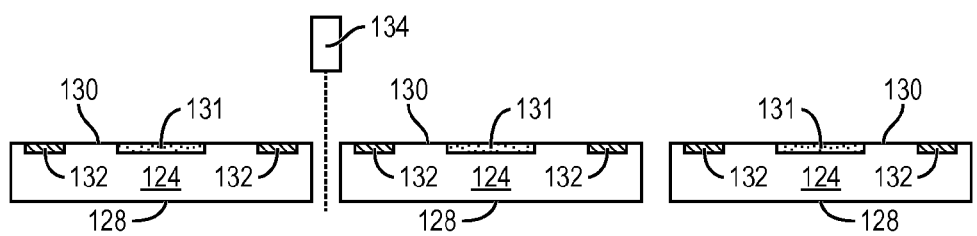

In FIG. 3c, semiconductor wafer 120 is singulated through saw street 126 using a saw blade or laser cutting tool 134 into individual semiconductor die 124.

Figure 4:
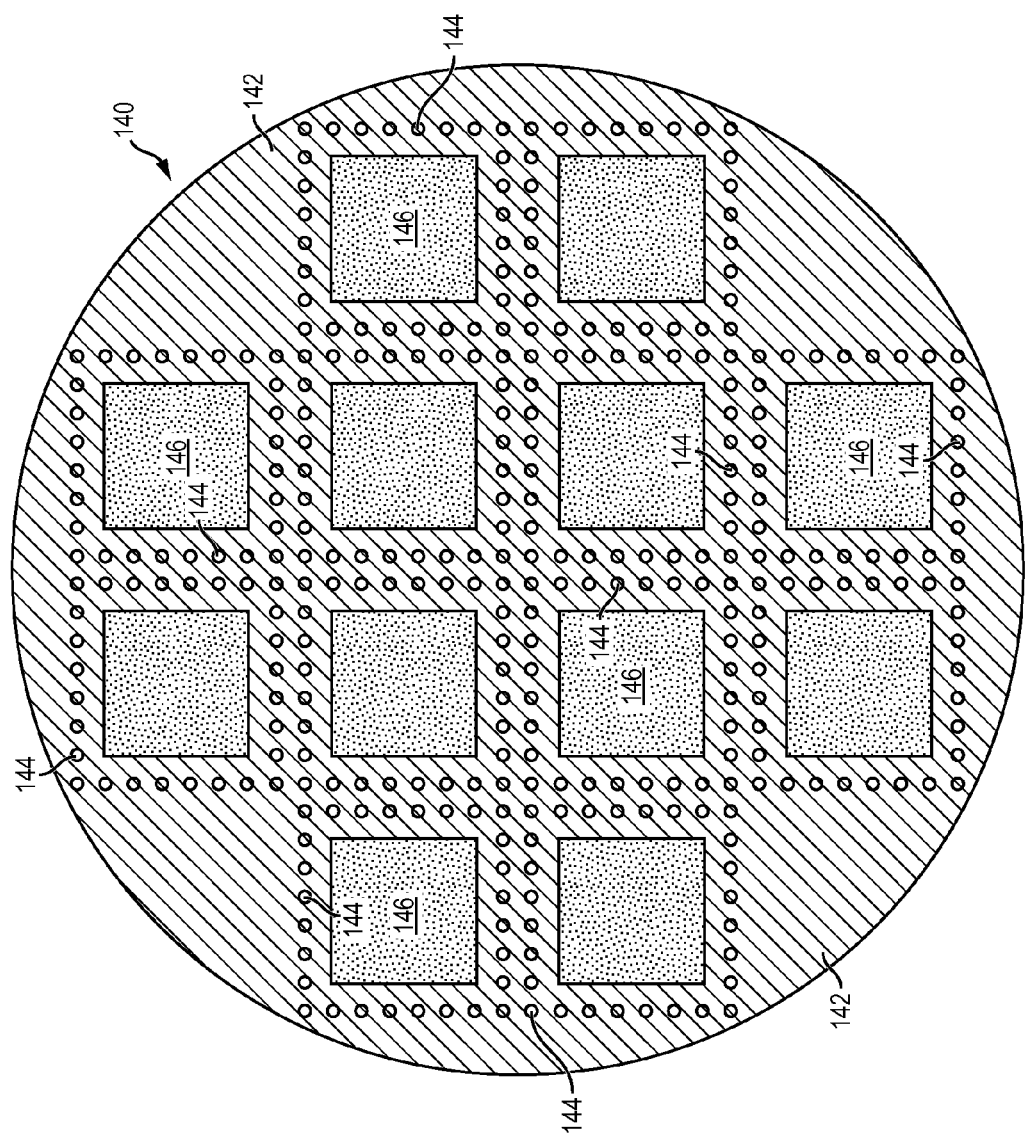
FIG. 4 illustrates a wafer-shape substrate with a base and conductive posts extending from the base.

FIG. 4 illustrates a wafer-shaped substrate or interposer 140 including a base 142 and multiple rows of conductive posts or leads 144 extending from the base. In one embodiment, substrate 140 is an un-singulated preformed or prefabricated laminated substrate made with leadframe manufacturing techniques, such as stamping. Substrate 140 includes a plurality of die-attach areas 146 between conductive posts 144 of sufficient size for mounting a semiconductor die to the base 142 of substrate 140.

Figure 5:
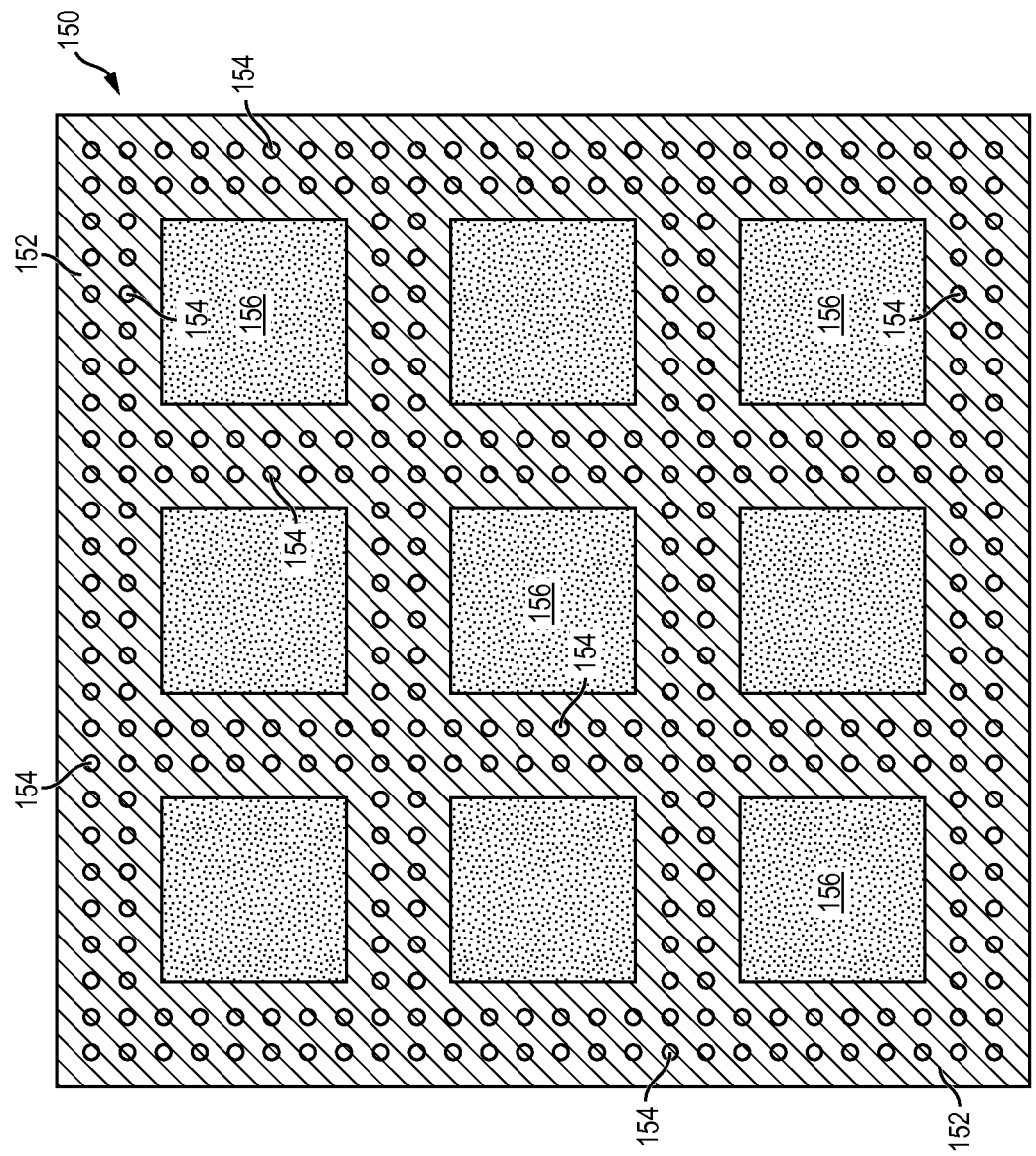
FIG. 5 illustrates a strip substrate with a base and conductive posts extending from the base.

FIG. 5 illustrates a panel or strip substrate or interposer 150 including a base 152 and multiple rows of conductive posts or leads 154 extending from the base. In one embodiment, substrate 150 is an un-singulated preformed or prefabricated laminated substrate made with leadframe manufacturing techniques, such as stamping. Substrate 150 includes a plurality of die-attach areas 156 between conductive posts 154 of sufficient size for mounting a semiconductor die to the base 152 of substrate 150.

Figure 6A:
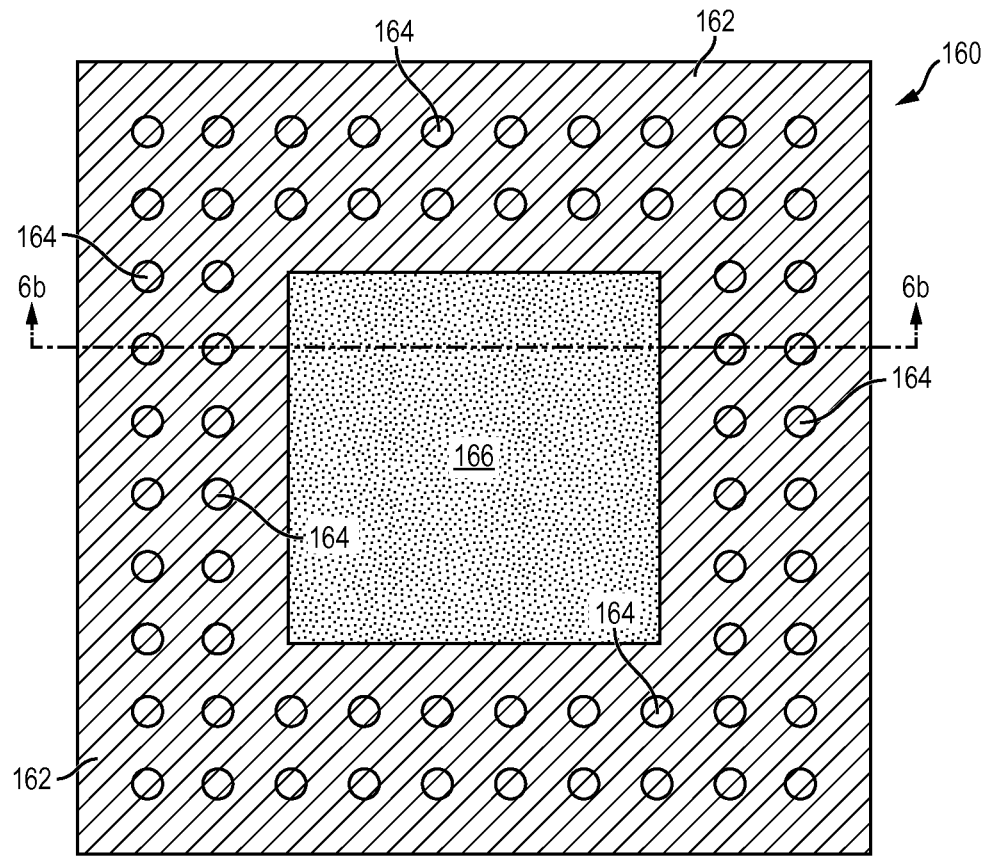
FIGS. 6a-6l illustrate a singulated sensor package including a substrate with a base and conductive posts extending from the base.

FIG. 6a illustrates a singulated substrate, strip substrate, wafer-shaped substrate, pre-plated frame, panel, or interposer 160 including a base 162 and multiple rows of conductive posts, fingers, or leads 164 extending from the base. In one embodiment, substrate 160 is a preformed or prefabricated laminated substrate made with leadframe manufacturing techniques, such as stamping. Substrates 140-160 can be gold, silver, nickel, platinum, copper, copper alloys (including one or more elements of nickel, iron, zinc, tin, chromium, silver, and phosphorous), or other suitable conductive materials. Substrate 160 includes a die-attach area 166 between conductive posts 164 of sufficient size for mounting a semiconductor die to die-attach area 166. In some embodiments, substrate 160 is designed such that conductive posts 164 surround die-attach areas 166. In some embodiments, substrate 160 is designed such that conductive posts 164 are disposed partially around die-attach areas 166.

Figure 6B:
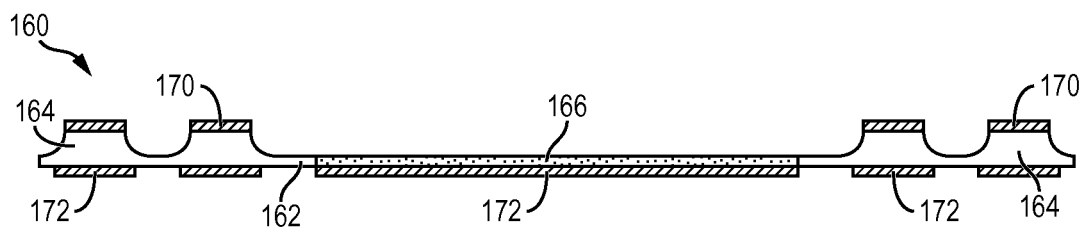

FIG. 6b illustrates a cross-sectional view of substrate 160 with base 162 and multiple rows of conductive posts or leads 164 extending from the base, as taken along line 6b-6b of FIG. 6a. Die-attach area 166 is disposed on base 162 between conductive posts 164 or in an area devoid of conductive posts 164. In one embodiment, base 162 has a thickness of 100-200 micrometers (μm), and posts 164 have a height of 80-300 μm, diameter or cross-sectional width of 50-250 μm, and pitch of 100-500 μm. By nature of extending from base 162, conductive posts 164 have a fixed spacing between posts. The base and posts of substrates 140 and 150 have a similar cross-section as FIGS. 6b-6c. In some embodiments, each of conductive posts 164 has top 170 and bottom 172 contact pads formed on opposing surfaces of conductive posts 164 using PVD, CVD, electrolytic plating, electroless plating process, or other suitable metal deposition process. Contact pads 170 and 172 can be one or more layers of Al, Cu, Sn, Ni, Au, Ag, or other suitable electrically conductive material. Contact pads 170 and 172 provide interconnection to other system components. In some embodiments, contact pads 170 and 172 comprise conductive paste, stud bump, micro bump, or other electrical interconnect.

Figure 6C:
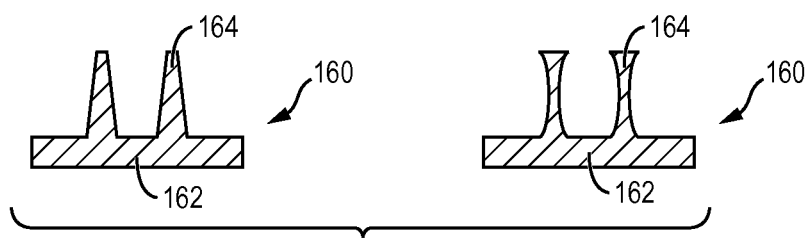

Conductive posts 164 can be rectangular, circular, hexagonal, or other geometric shape. Conductive posts 164 can also have a tapered shape, as shown in FIG. 6c, with the narrower end ranging from 30-200 μm and the wider end ranging from 50-300 μm. FIG. 6c also shows posts 164 with a thinner intermediate portion.

Figure 6D:
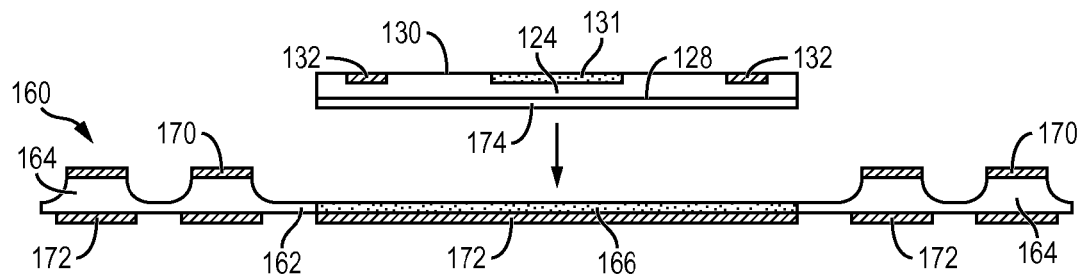

In FIG. 6d, semiconductor die 124 from FIG. 3c is mounted to die-attach area 166 of substrate 160 using, for example, a pick and place operation with back surface 128 oriented toward substrate 160. Semiconductor die 124 can also be mounted to die-attach area 156 of substrate 150, or to die-attach area 146 of substrate 140. A die-attach material 174 is disposed on semiconductor die 124 between back surface 128 and die-attach area 166 to bond semiconductor die 124 to die-attach area 166. Alternatively, die-attach material 174 may be formed on semiconductor die 124 at the wafer level before singulation as illustrated by FIGS. 3a-3c. Die-attach material 174 may comprise single or multi-layer polymer, such as b-staged curable epoxy resin, resistant to heat and mechanical stress. Die-attach material 174 may comprise penetrable adhesive layer, wire-penetrable attach material, thermal release film material, or tape. In some embodiments, semiconductor die 124 is mounted to die-attach area 166 of substrate with active surface 130 oriented toward substrate 160. A portion of substrate 160 may be removed by an exposure or development process, laser direct ablation (LDA), etching, or other suitable process to form openings (not shown) for vertical interconnect from active surface 130 to contact pads 172.

Figure 6E:
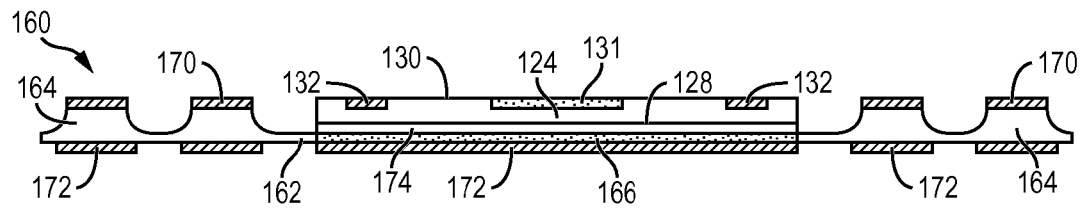
Figure 6F:
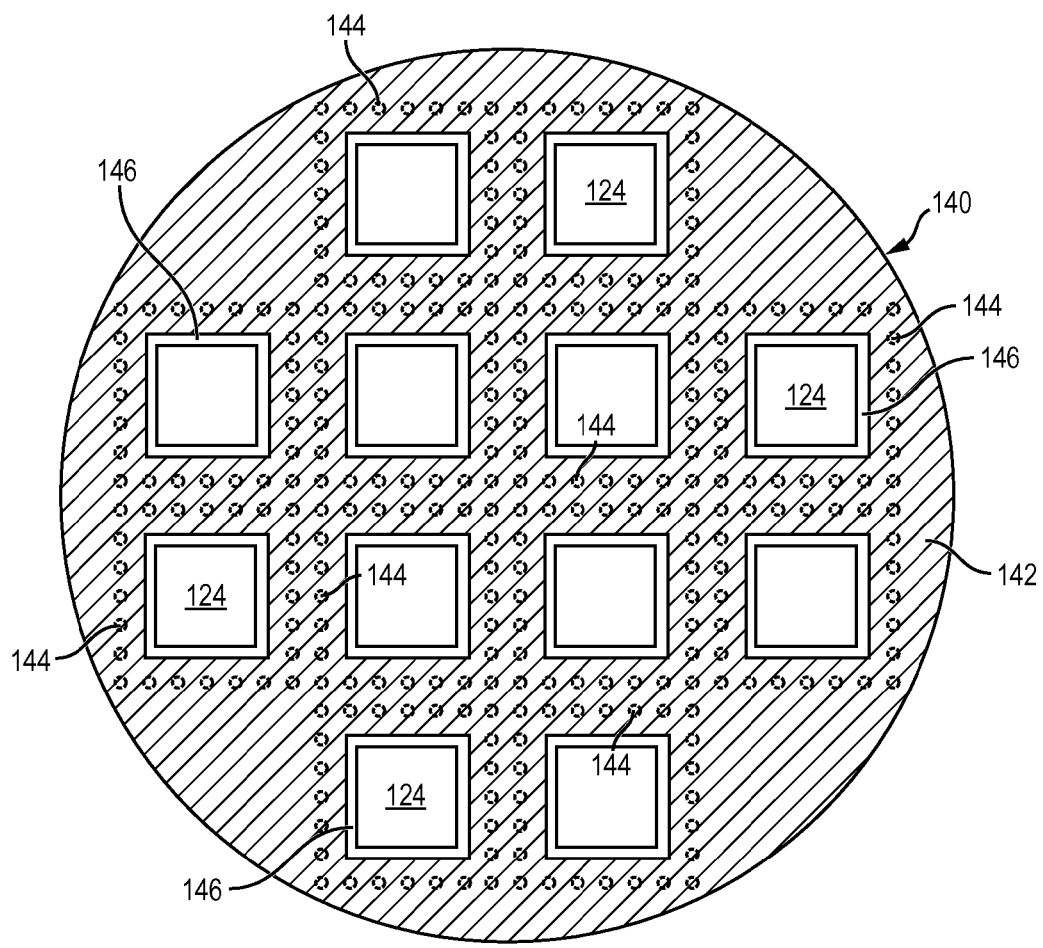

FIG. 6e shows semiconductor die 124 mounted to die-attach area 166 of substrate 160 with active surface 130 extending away from substrate 160. In some embodiments, semiconductor die 124 is disposed over die-attach area 166 below a height of conductive posts 164. Alternatively, semiconductor die 124 is disposed over die-attach area 166 and above, or partially above a height of conductive posts 164. Semiconductor die 124 may be disposed over die-attach area 166 such that active surface 130 is coplanar with contact pads 170. FIG. 6f shows a plan view of semiconductor die 124 mounted to substrate 140 on die-attach areas 146.

Figure 6G:
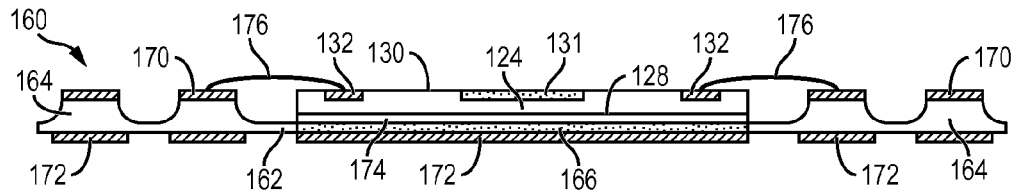

In FIG. 6g, an interconnect structure is formed between conductive layer 132 of semiconductor die 124 and contact pads 170 of conductive posts 164. In some embodiments, interconnect structure is a plurality of wirebonds 176 formed between conductive layer 132 of semiconductor die 124 and contact pads 170. Wirebonds 176 electrically connect semiconductor die 124 to substrate 160. In some embodiments, interconnect structure is an electrically conductive layer or redistribution layer (RDL) formed using a patterning and metal deposition process such as sputtering, electrolytic plating, and electroless plating. Conductive layer can be one or more layers of Al, Cu, Sn, Ni, Au, Ag, or other suitable electrically conductive material. In some embodiments, interconnect structure is a build-up layer formed by the combination of conductive layers and insulating layers formed over semiconductor die 124 and conductive posts 164. The interconnect structure can also use conductive paste, stud bump, micro bump, or other electrical interconnect.

Figure 6H:
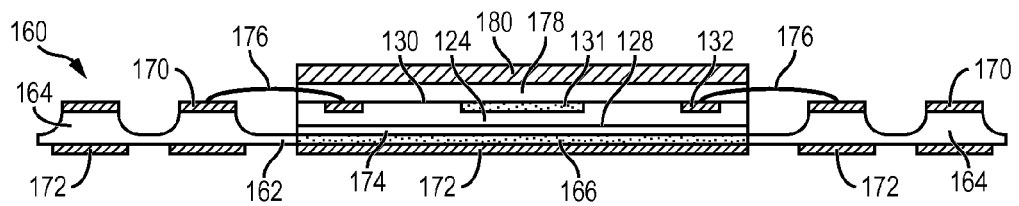

In FIG. 6h, penetrable adhesive layer, wire-penetrable attach material, thermal release film material, or tape 178 is disposed over active surface 130, sensor area 131, and wirebonds 176 within a footprint of semiconductor die 124. A portion of wirebonds 176 penetrate into penetrable adhesive layer 178 and are embedded within the layer. Penetrable adhesive layer 178 is a thermal release film material that loses adhesion upon being heated at elevated temperatures and can be easily removed from active surface 130 during a debonding process. Penetrable adhesive layer 178 reduces damage imposed on the active surface 130 and protects sensor area 131 and active surface 130 of semiconductor die 124. In some embodiments, penetrable adhesive layer 178 can be single or multi-layer polymer, such as b-staged curable epoxy resin, resistant to heat and mechanical stress. In some embodiments, penetrable adhesive layer 178 does not cover one or more wirebonds 176.

An etchable and sacrificial cap layer, temporary substrate, or carrier 180 is disposed over a footprint of penetrable adhesive layer 178 containing sacrificial base material such as silicon, polymer, polymer composite, metal, ceramic, glass, glass epoxy, beryllium oxide, or other suitable low-cost, rigid material for structural support. In some embodiments, sacrificial cap layer 180 is an electrically conductive layer or redistribution layer RDL 180 formed over semiconductor die 124 and penetrable adhesive layer 178 using a patterning and metal deposition process such as sputtering, electrolytic plating, and electroless plating. Conductive layer 180 can be one or more layers of Al, Cu, Sn, Ni, Au, Ag, or other suitable electrically conductive material. In some embodiments, one portion of conductive layer 180 may be electrically connected to wirebonds 176. Other portions of conductive layer 180 can be electrically common or electrically isolated depending on the design and function of semiconductor die 124.

Figure 6I:
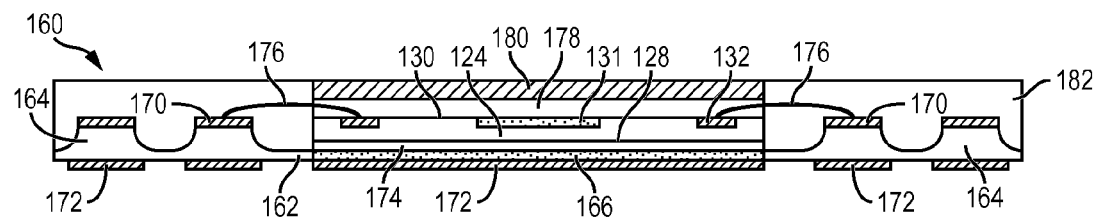

In FIG. 6i, an encapsulant or molding compound 182 is deposited over semiconductor die 124, substrate 160, around wirebonds 176, and around conductive posts 164 using a paste printing, compressive molding, transfer molding, liquid encapsulant molding, vacuum lamination, spin coating, or other suitable applicator. Encapsulant 182 can be polymer composite material, such as epoxy resin with filler, epoxy acrylate with filler, or polymer with proper filler. Encapsulant 182 is non-conductive and environmentally protects the semiconductor device from external contaminants. Encapsulant 182 can be thinned in a subsequent backgrinding step such that the encapsulant is coplanar with sacrificial cap layer 180. A chemical etch can also be used to planarize encapsulant 182 with sacrificial cap layer 180. In some embodiments, encapsulant 182 is thinned or partially removed to expose one or more side surfaces of semiconductor die 124.

Figure 6J:
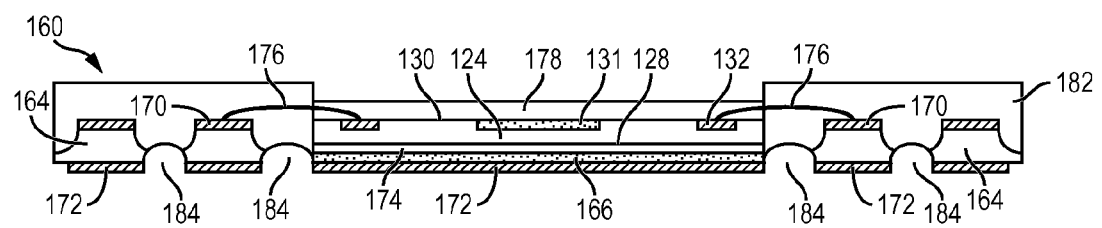

In FIG. 6j, penetrable adhesive layer 178 is heated to reduce adhesion of the layer to sacrificial cap layer 180. Consequently, sacrificial cap layer 180 can easily be removed from penetrable adhesive layer 178. The delicate removal of sacrificial cap layer 180 from penetrable adhesive layer 178 protects active surface 130 and sensor area 131 of semiconductor die 124. Alternatively, sacrificial cap layer 180 may be removed by an exposure or development process, LDA, etching, or other suitable process.

A portion of substrate 160 is removed by an exposure or development process, LDA, etching, or other suitable process to form openings 184 in substrate 160 and electrically isolate one or more conductive posts 164. In some embodiments, a portion of encapsulant 182 is also removed by an exposure or development process, LDA, etching, or other suitable process.

Figure 6K:
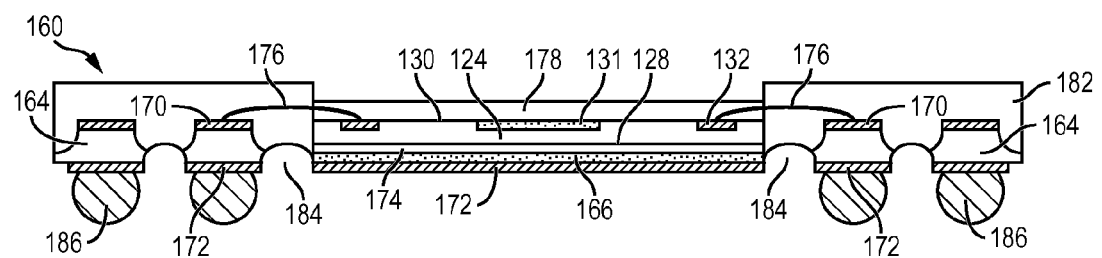

In FIG. 6k, an electrically conductive bump material 186 is deposited over bottom contact pads 172 of conductive posts 164 using an evaporation, electrolytic plating, electroless plating, ball drop, or screen printing process. Bump material 186 can be Al, Sn, Ni, Au, Ag, Pb, Bi, Cu, solder, and combinations thereof, with an optional flux solution. For example, the bump material can be eutectic Sn/Pb, high-lead solder, or lead-free solder. Bump material 186 is bonded to contact pads 172 using a suitable attachment or bonding process. In one embodiment, the bump material is reflowed by heating the material above its melting point to form spherical balls or bumps 186. In some applications, bumps 186 are reflowed a second time to improve electrical contact to contact pads 172. In one embodiment, bumps 186 are formed over an under bump metallization (UBM) having a wetting layer, barrier layer, and adhesive layer. The bumps can also be compression bonded or thermocompression bonded to contact pads 172. Bumps 186 represent one type of interconnect structure that can be formed over contact pads 172. The interconnect structure can also use bond wires, conductive paste, stud bump, micro bump, or other electrical interconnect.

Figure 6L:
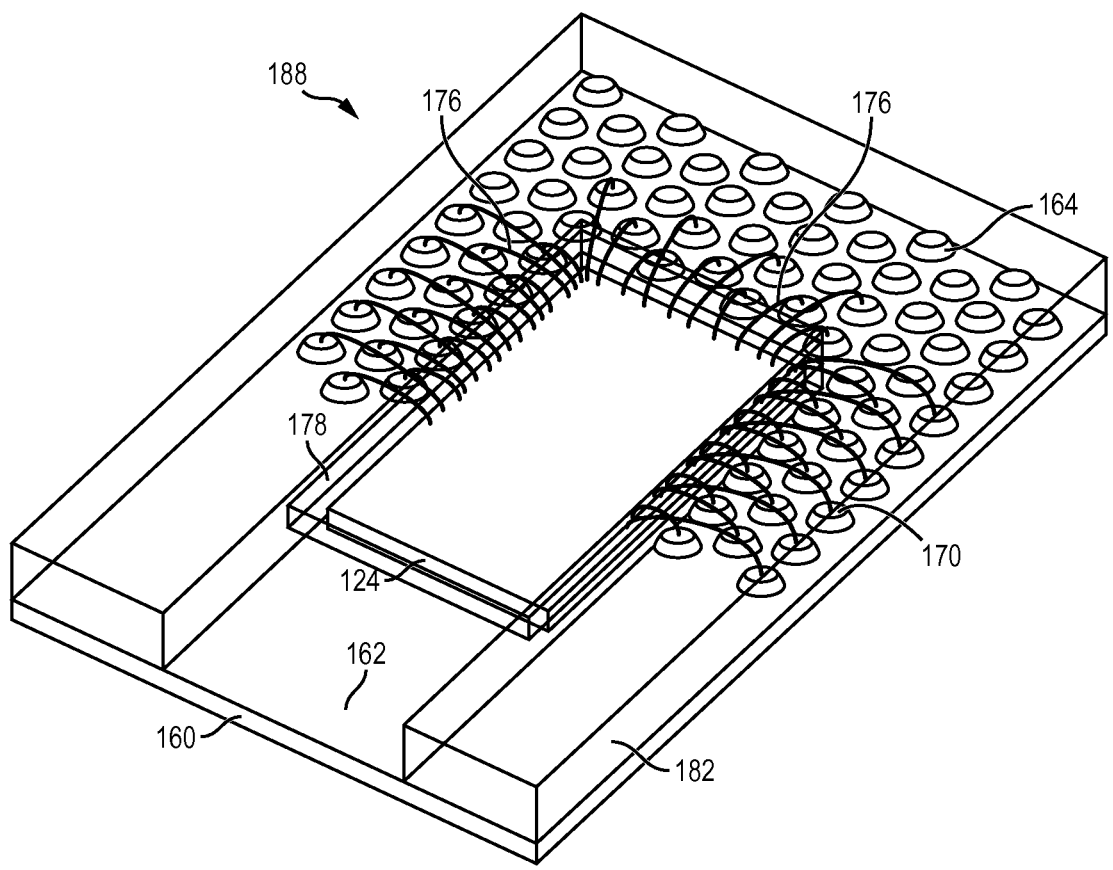

FIG. 6l illustrates a top view of the embedded sensor die package 188. Semiconductor die 124 with sensor area 131 is disposed on die-attach area 166 and embedded on substrate 160. Conductive posts 164 are disposed around semiconductor die 124. Wirebonds 176 electrically connect semiconductor die 124 to conductive posts 164 at contact pads 170 and at least a portion of wirebonds 176 are embedded within penetrable adhesive layer 178 and encapsulant 182 to preserve electrical connectivity. Semiconductor die 124 and sensor area 131 are protected by encapsulant 182 and penetrable adhesive layer 178. One portion of conductive posts 164 are electrically connected to substrate 160 and another portion of conductive posts 164 are electrically isolated from substrate 160. Sacrificial cap layer 180 is easily and delicately removed in order to reduce damage to sensor area 131. Sensor die package 188 protects the sensitive active surface 130 with sensor area 131 while providing interconnection to other system components.

Sensor die package 188 protects semiconductor die 124 with sensor area 131 by embedding semiconductor die 124 at the base 162 of substrate 160. Conductive posts 164 disposed around semiconductor die 124 provide additional protection, structural support for sensor die package 188, and higher density electrical connections. Sensor die package 188 has a reduced footprint with maximized protection to semiconductor die 124. Electrically isolating one or more conductive posts 164 provides greater flexibility for connecting sensor die package 188 to additional semiconductor components.

Penetrable adhesive layer 178 can provide multiple advantages. Penetrable adhesive layer 178 can serve as a protective layer for sensor area 131 during packaging. Penetrable adhesive layer 178 can also delicately adhere components over the sensitive sensor die area 131. Applying heat or elevated temperatures to the sensor die package 188 can reduce the adhesive properties of penetrable adhesive layer 178. As a result, the layer can be manipulated or repositioned on the sensor die package 188 according to its intended purpose with reduced harmful exposure to sensor area 131. In addition, using penetrable adhesive layer 178, sacrificial cap layer 180 or other semiconductor components can be carefully attached to and delicately removed from sensor die package 188 while significantly minimizing damage to sensor area 131 and active surface 130.

Figure 7A:
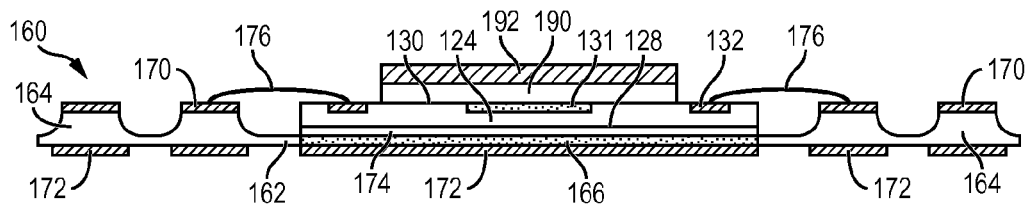
FIGS. 7a-7e illustrate an alternate embodiment of the sensor package with the sacrificial cap layer and penetrable adhesive layer not covering the interconnect structure.

FIGS. 7a-7e illustrate, in relation to FIGS. 1, 2a-2c, 3a-3c, 4, 5, and 6a-6g, an alternate embodiment of the sensor package with the sacrificial cap layer and penetrable adhesive layer not covering the interconnect structure. In FIG. 7a, similar to and continuing from FIG. 6g, an interconnect structure 176 is formed between conductive layers 132 of semiconductor die 124 and contact pads 170 of conductive posts 164. In some embodiments, interconnect structure is a plurality of wirebonds 176 formed between conductive layer 132 of semiconductor die 124 and contact pads 170. Wirebonds 176 electrically connect semiconductor die 124 to substrate 160. In some embodiments, interconnect structure is an electrically conductive layer or RDL formed using a patterning and metal deposition process such as sputtering, electrolytic plating, and electroless plating. Conductive layer can be one or more layers of Al, Cu, Sn, Ni, Au, Ag, or other suitable electrically conductive material. In some embodiments, interconnect structure is a build-up layer formed by the combination of conductive layers and insulating layers formed over semiconductor die 124 and conductive posts 164. The interconnect structure can also use conductive paste, stud bump, micro bump, or other electrical interconnect.

A penetrable adhesive layer, wire-penetrable attach material, thermal release film material, or tape 190 is disposed over a portion of active surface 130 within a footprint of semiconductor die 124. Penetrable adhesive layer 190 does not cover or contact at least a portion of wirebonds 176. Penetrable adhesive layer 190 is a thermal release film material that loses adhesion upon being heated at elevated temperatures and can be easily removed from active surface 130 during a debonding process. In some embodiments, penetrable adhesive layer 190 can be single or multi-layer polymer, such as b-staged curable epoxy resin, resistant to heat and mechanical stress. Penetrable adhesive layer 190 reduces damage imposed on the active surface 130 and protects sensor area 131 and active surface 130 of semiconductor die 124.

An etchable and sacrificial cap layer, temporary substrate, or carrier 192 is disposed over a footprint of penetrable adhesive layer 190 containing sacrificial base material such as silicon, polymer, polymer composite, metal, ceramic, glass, glass epoxy, beryllium oxide, or other suitable low-cost, rigid material for structural support. In some embodiments, sacrificial cap layer 192 is an electrically conductive layer or RDL 192 formed over semiconductor die 124 and penetrable adhesive layer 190 using a patterning and metal deposition process such as sputtering, electrolytic plating, and electroless plating. Conductive layer 192 can be one or more layers of Al, Cu, Sn, Ni, Au, Ag, or other suitable electrically conductive material.

Figure 7B:
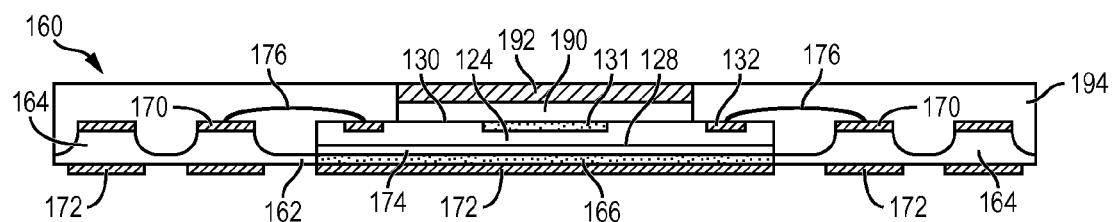

In FIG. 7b, an encapsulant or molding compound 194 is deposited over semiconductor die 124, substrate 160, around wirebonds 176, and around conductive posts 164 using a paste printing, compressive molding, transfer molding, liquid encapsulant molding, vacuum lamination, spin coating, or other suitable applicator. Encapsulant 194 can be polymer composite material, such as epoxy resin with filler, epoxy acrylate with filler, or polymer with proper filler. Encapsulant 194 is non-conductive and environmentally protects the semiconductor device from external contaminants. Encapsulant 194 can be thinned in a subsequent backgrinding step such that the encapsulant is coplanar with sacrificial cap layer 192. A chemical etch can also be used to planarize encapsulant 194 with sacrificial cap layer 192. In some embodiments, encapsulant 194 is thinned or partially removed to expose one or more side surfaces of semiconductor die 124.

Figure 7C:
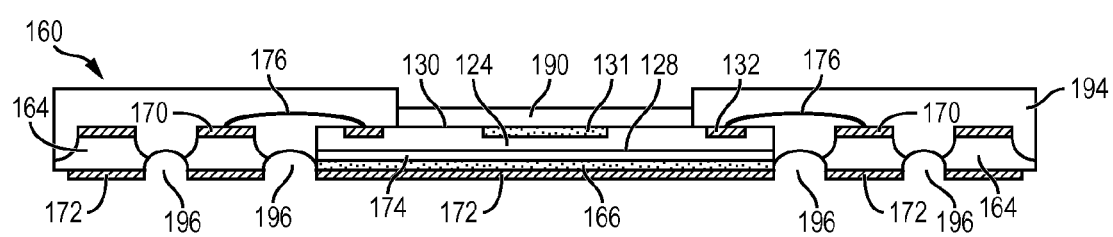

In FIG. 7c, penetrable adhesive layer 190 is heated to reduce adhesion of the layer to sacrificial cap layer 192. Consequently, sacrificial cap layer 192 can be easily removed from penetrable adhesive layer 190. The delicate removal of sacrificial cap layer 192 from penetrable adhesive layer 190 protects active surface 130 and sensor area 131 of semiconductor die 124. Alternatively, sacrificial cap layer 192 may be removed by an exposure or development process, LDA, etching, or other suitable process.

A portion of substrate 160 is removed by an exposure or development process, LDA, etching, or other suitable process to form openings 196 in substrate 160 and electrically isolate one or more conductive posts 164. In some embodiments, a portion of encapsulant 194 is also removed by an exposure or development process, LDA, etching, or other suitable process.

Figure 7D:
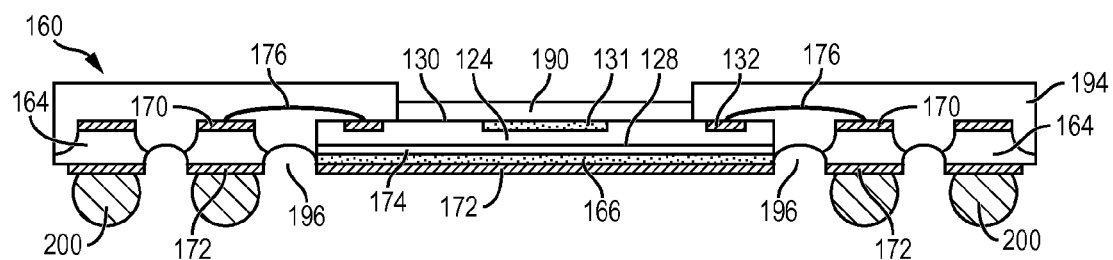

In FIG. 7d, an electrically conductive bump material 200 is deposited over bottom contact pads 172 of substrate 160 using an evaporation, electrolytic plating, electroless plating, ball drop, or screen printing process. Bump material 200 can be Al, Sn, Ni, Au, Ag, Pb, Bi, Cu, solder, and combinations thereof, with an optional flux solution. For example, the bump material can be eutectic Sn/Pb, high-lead solder, or lead-free solder. Bump material 200 is bonded to contact pads 172 using a suitable attachment or bonding process. In one embodiment, the bump material is reflowed by heating the material above its melting point to form spherical balls or bumps 200. In some applications, bumps 200 are reflowed a second time to improve electrical contact to contact pads 172. In one embodiment, bumps 200 are formed over a UBM having a wetting layer, barrier layer, and adhesive layer. The bumps can also be compression bonded or thermocompression bonded to contact pads 172. Bumps 200 represent one type of interconnect structure that can be formed over contact pads 172. The interconnect structure can also use bond wires, conductive paste, stud bump, micro bump, or other electrical interconnect.

Figure 7E:
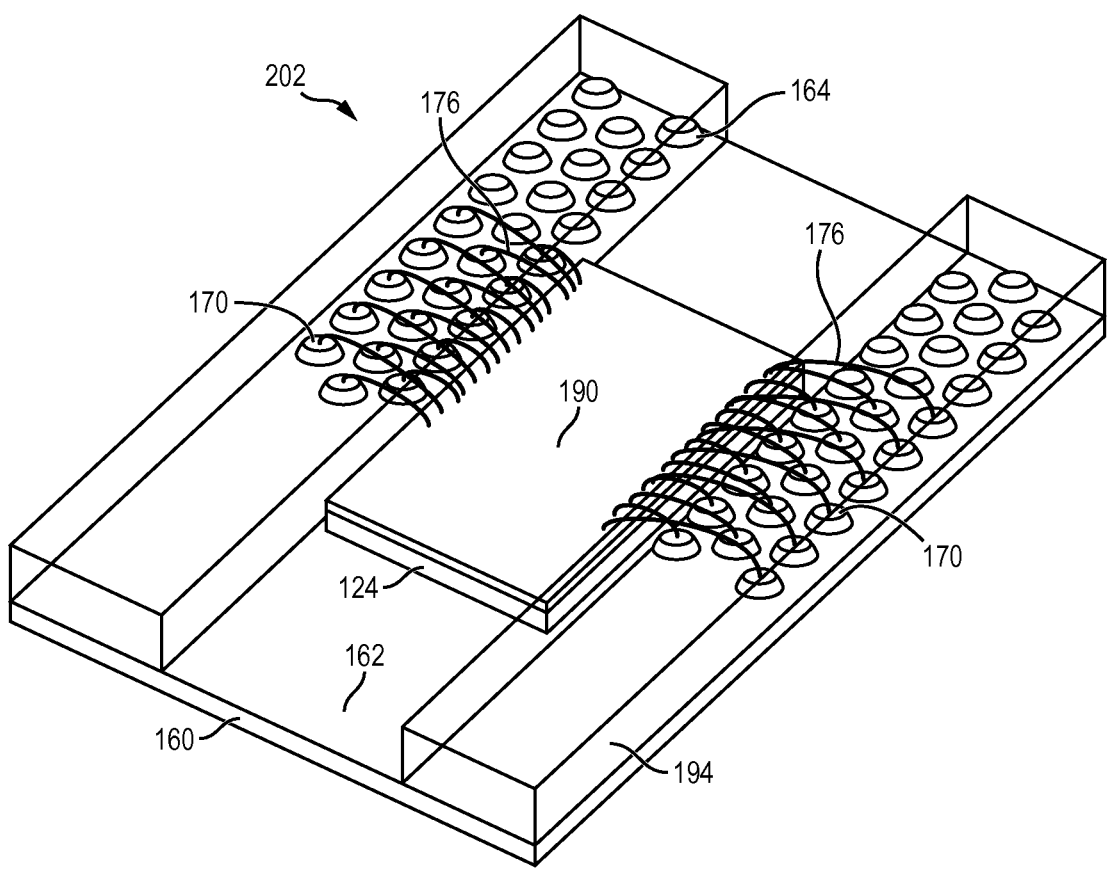

FIG. 7e illustrates a top view of the embedded sensor die package 202. Semiconductor die 124 with sensor area 131 is disposed on die-attach area 166 and embedded on substrate 160. Conductive posts 164 are disposed around semiconductor die 124. Wirebonds 176 electrically connect semiconductor die 124 to conductive posts 164 at contact pads 170 and at least a portion of wirebonds 176 are embedded within encapsulant 194 to preserve electrical connectivity. Semiconductor die 124 and sensor area 131 are protected by encapsulant 194 and penetrable adhesive layer 190. Penetrable adhesive layer 190 does not cover at least one or more wirebonds 176. One portion of conductive posts 164 are electrically connected to substrate 160 and another portion of conductive posts 164 are electrically isolated from substrate 160. Sacrificial cap layer 192 is easily and delicately removed in order to reduce damage to sensor area 131. Sensor die package 202 protects the sensitive active surface 130 with sensor area 131 while providing interconnection to other system components.

Sensor die package 202 protects semiconductor die 124 with sensor area 131 by embedding semiconductor die 124 at the base 162 of substrate 160. Conductive posts 164 disposed around semiconductor die 124 provide additional protection, structural support for the sensor die package 202, and higher density electrical connections. Sensor die package 202 has a reduced footprint with maximized protection to semiconductor die 124. Electrically isolating one or more conductive posts 164 provides greater flexibility for connecting sensor die package 202 to additional semiconductor components.

Penetrable adhesive layer 190 can provide multiple advantages. Penetrable adhesive layer 190 can serve as a protective layer for sensor area 131 during packaging. Penetrable adhesive layer 190 can also delicately adhere components over the sensitive sensor die area 131. Applying heat or elevated temperatures to the sensor die package 202 can reduce the adhesive properties of penetrable adhesive layer 190. As a result, the layer can be manipulated or repositioned on the sensor die package 202 according to its intended purpose with reduced harmful exposure to sensor area 131. In addition, using penetrable adhesive layer 190, sacrificial cap layer 192 or other semiconductor components can be carefully attached to and delicately removed from sensor die package 202 while significantly minimizing damage to sensor area 131 and active surface 130.

Figure 8A:
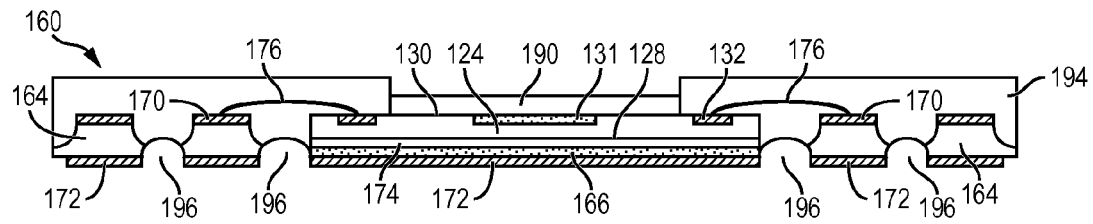
FIGS. 8a-8c illustrate an alternate embodiment of the sensor package with an exposed sensor.
Figure 8B:
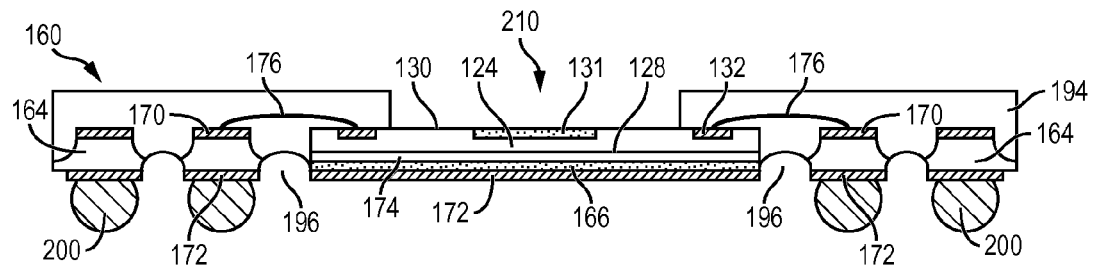
Figure 8C:
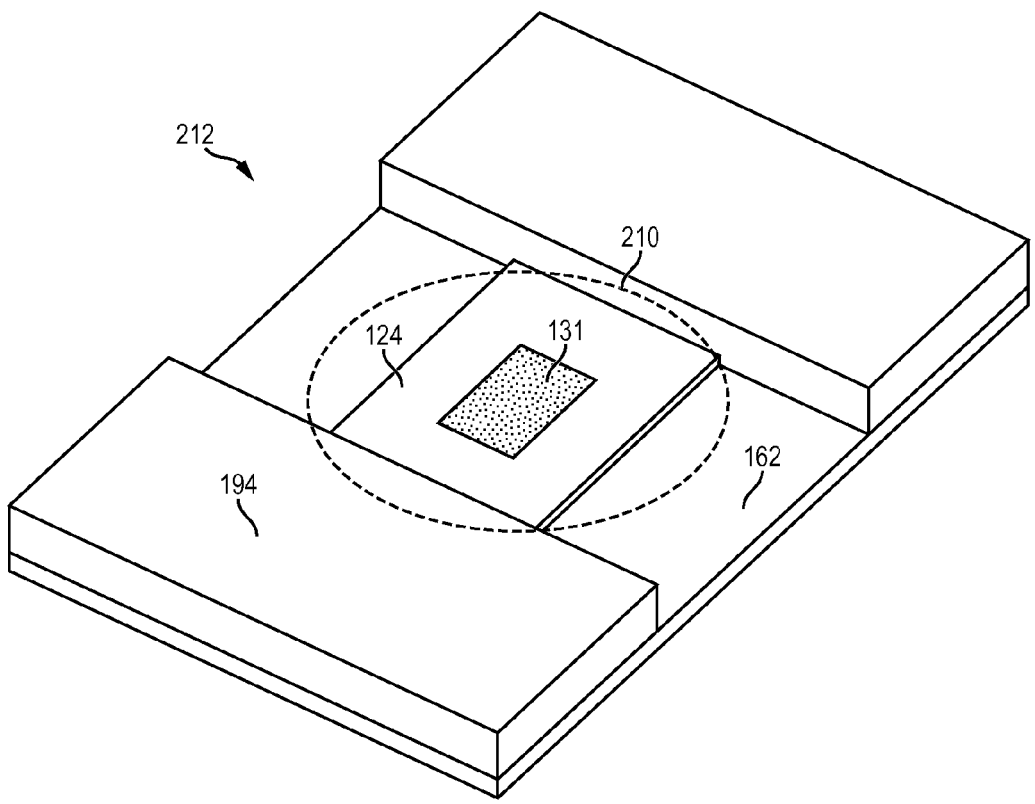

FIGS. 8a-8c illustrate, in relation to FIGS. 1, 2a-2c, 3a-3c, 4, 5, and 7a-7c, an alternate embodiment of the sensor package with an exposed sensor area. In FIG. 8a, similar to and continuing from FIG. 7c, a penetrable adhesive layer, wire-penetrable attach material, thermal release film material, or tape 190 is disposed over a portion of active surface 130 within a footprint of semiconductor die 124. Penetrable adhesive layer 190 does not cover or contact at least a portion of wirebonds 176. Penetrable adhesive layer 190 is a thermal release film material that loses adhesion upon being heated at elevated temperatures and can be easily removed from active surface 130 during a debonding process. Penetrable adhesive layer 190 does not cover or contact at least a portion of wirebonds 176. In some embodiments, penetrable adhesive layer 190 can be single or multi-layer polymer, such as b-staged curable epoxy resin, resistant to heat and mechanical stress. Penetrable adhesive layer 190 reduces damage imposed on the active surface 130 and protects sensor area 131 and active surface 130 of semiconductor die 124. Sacrificial cap layer 192 has been removed from the surface of penetrable adhesive layer 190.

An encapsulant or molding compound 194 is deposited over semiconductor die 124, substrate 160, around wirebonds 176, and around conductive posts 164 using a paste printing, compressive molding, transfer molding, liquid encapsulant molding, vacuum lamination, spin coating, or other suitable applicator. Encapsulant 194 can be polymer composite material, such as epoxy resin with filler, epoxy acrylate with filler, or polymer with proper filler. Encapsulant 194 is non-conductive and environmentally protects the semiconductor device from external contaminants. Encapsulant 194 does not cover at least a portion of penetrable adhesive layer 190.

A portion of substrate 160 has been removed by an exposure or development process, LDA, etching, or other suitable process to form openings 196 in substrate 160 and electrically isolate one or more conductive posts 164. In some embodiments, encapsulant 194 is thinned or partially removed to expose one or more side surfaces of semiconductor die 124. In some embodiments, a portion of encapsulant 194 is also removed by an exposure or development process, LDA, etching, or other suitable process.

In FIG. 8b, penetrable adhesive layer 190 is heated to reduce adhesion of the layer to active surface 130 of semiconductor die 124. Consequently, penetrable adhesive layer 190 can be removed from active surface 130 of semiconductor die 124 to create an exposed die area 210 of active surface 130 and sensor area 131. The delicate removal of penetrable adhesive layer 190 protects active surface 130 and sensor area 131 of semiconductor die 124. Alternatively, penetrable adhesive layer 190 may be removed by an exposure or development process, LDA, etching, or other suitable process.

FIG. 8c illustrates a top view of the embedded sensor die package 212. Semiconductor die 124 with sensor area 131 is disposed on die-attach area 166 and embedded on substrate 160. Conductive posts 164 (not shown) are disposed around semiconductor die 124. Wirebonds 176 (not shown) electrically connect semiconductor die 124 to conductive posts 164 at contact pads 170 and at least a portion of wirebonds 176 are embedded within encapsulant 194 to preserve electrical connectivity. Semiconductor die 124 and sensor area 131 are protected by encapsulant 194 and substrate 160. Penetrable adhesive layer 190 is removed to reveal exposed die area 210. Penetrable adhesive layer 190 does not cover at least a portion of wirebonds 176. One portion of conductive posts 164 are electrically connected to substrate 160 and another portion of conductive posts 164 are electrically isolated from substrate 160. Sacrificial cap layer 192 and penetrable adhesive layer 190 are easily and delicately removed in order to reduce damage to sensor area 131. Sensor die package 212 protects the sensitive active surface 130 with exposed sensor area 131 while providing interconnection to other system components. In some embodiments, not all of penetrable adhesive layer 190 is removed such that a portion of penetrable adhesive layer 190 may remain over active surface 130.

Sensor die package 212 protects semiconductor die 124 with sensor area 131 by embedding semiconductor die 124 at the base 162 of substrate 160. Conductive posts 164 disposed around semiconductor die 124 provide additional protection, structural support for the sensor die package 212, and higher density electrical connections. Sensor die package 212 has a reduced footprint with maximized protection to semiconductor die 124. Electrically isolating one or more conductive posts 164 provides greater flexibility for connecting sensor die package 212 to additional semiconductor components.

Penetrable adhesive layer 190 can provide multiple advantages. Penetrable adhesive layer 190 can serve as a protective layer for sensor area 131 during packaging. Penetrable adhesive layer 190 can also delicately adhere components over the sensitive sensor die area 131. Applying heat or elevated temperatures to the sensor die package 212 can reduce the adhesive properties of penetrable adhesive layer 190. As a result, the layer can be manipulated, repositioned on, or removed from the sensor die package according to its intended purpose with reduced harmful exposure to sensor area 131. In addition, using penetrable adhesive layer 190, sacrificial cap layer 192 or other semiconductor components can be carefully attached to and delicately removed from sensor die package 212 while significantly minimizing damage to sensor area 131 and active surface 130.

Figure 9A:
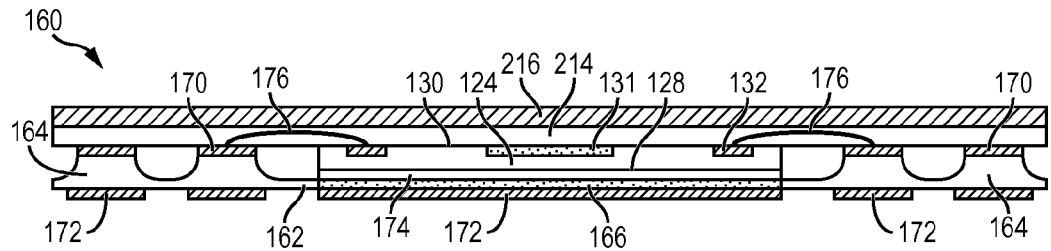
FIGS. 9a-9e illustrate an alternate embodiment of the sensor package with the sacrificial cap layer and penetrable adhesive layer covering a surface of the sensor package.

FIGS. 9a-9e illustrate, in relation to FIGS. 1, 2a-2c, 3a-3c, 4, 5, and 6a-6g, an alternate embodiment of the sensor package with the sacrificial cap layer and penetrable adhesive layer covering the surface of the sensor package. In FIG. 9a, similar to and continuing from FIG. 6g, a penetrable adhesive layer, wire-penetrable attach material, thermal release film material, or tape 214 is disposed over active surface 130, sensor area 131, wirebonds 176, and substrate 160 to cover contact pads 170. Wirebonds 176 penetrate into penetrable adhesive layer 214 and are embedded within the layer. Penetrable adhesive layer 214 is a thermal release film material that loses adhesion upon being heated at elevated temperatures and can be easily removed from active surface 130 during a debonding process. In some embodiments, penetrable adhesive layer 214 can be single or multi-layer polymer, such as b-staged curable epoxy resin, resistant to heat and mechanical stress. Penetrable adhesive layer 214 reduces damage imposed on the active surface 130 and protects sensor area 131 and active surface 130 of semiconductor die 124.

An etchable and sacrificial cap layer, temporary substrate, or carrier 216 is disposed over penetrable adhesive layer 214 containing sacrificial base material such as silicon, polymer, polymer composite, metal, ceramic, glass, glass epoxy, beryllium oxide, or other suitable low-cost, rigid material for structural support. In some embodiments, sacrificial cap layer 216 is an electrically conductive layer or RDL 216 formed over semiconductor die 124 and penetrable adhesive layer 214 using a patterning and metal deposition process such as sputtering, electrolytic plating, and electroless plating. Conductive layer 216 can be one or more layers of Al, Cu, Sn, Ni, Au, Ag, or other suitable electrically conductive material. In some embodiments, one portion of conductive layer 216 may be electrically connected to wirebonds 176. Other portions of conductive layer 216 can be electrically common or electrically isolated depending on the design and function of semiconductor die 124.

Figure 9B:
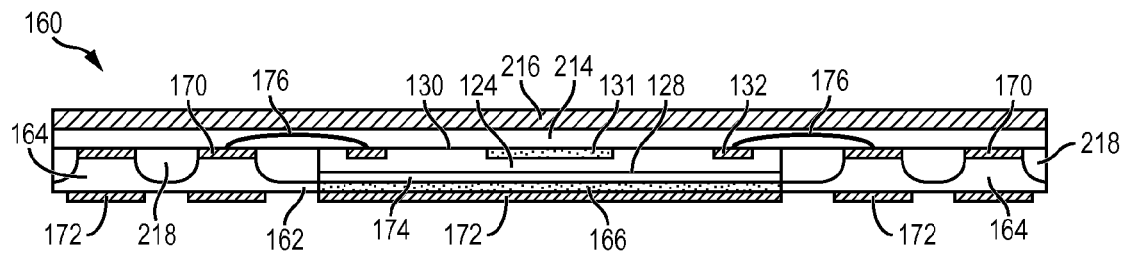

In FIG. 9b, an encapsulant or molding compound 218 is deposited over semiconductor die 124, substrate 160, around wirebonds 176, and around conductive posts 164 using a paste printing, compressive molding, transfer molding, liquid encapsulant molding, vacuum lamination, spin coating, or other suitable applicator. Encapsulant 218 can be polymer composite material, such as epoxy resin with filler, epoxy acrylate with filler, or polymer with proper filler. Encapsulant 218 is non-conductive and environmentally protects the semiconductor device from external contaminants. In some embodiments, encapsulant 218 is thinned or partially removed to expose one or more side surfaces of semiconductor die 124.

Figure 9C:
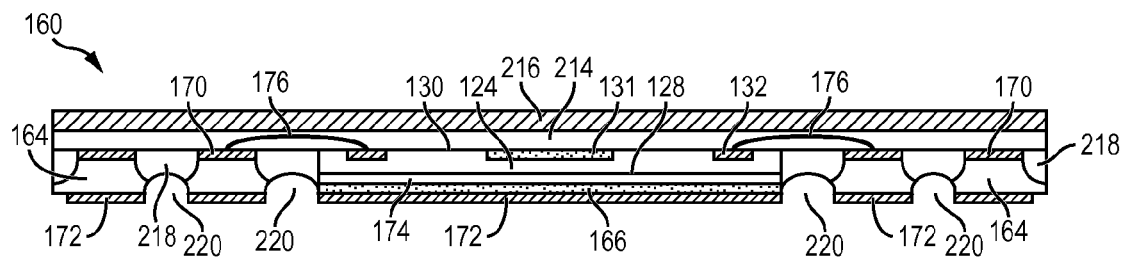

In FIG. 9c, a portion of substrate 160 is removed by an exposure or development process, LDA, etching, or other suitable process to form openings 220 in substrate 160 and electrically isolate one or more conductive posts 164. In some embodiments, a portion of encapsulant 218 is also removed by an exposure or development process, LDA, etching, or other suitable process.

Figure 9D:
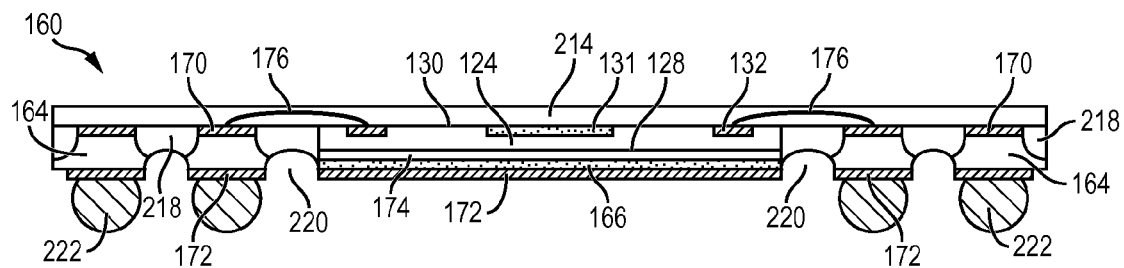

In FIG. 9d, penetrable adhesive layer 214 is heated to reduce adhesion of the layer to sacrificial cap layer 216. Consequently, sacrificial cap layer 216 can be easily removed from penetrable adhesive layer 214. The delicate removal of sacrificial cap layer 216 from penetrable adhesive layer 214 protects active surface 130 and sensor area 131 of semiconductor die 124. Alternatively, sacrificial cap layer 216 may be removed by an exposure or development process, LDA, etching, or other suitable process.

An electrically conductive bump material 222 is deposited over bottom contact pads 172 of substrate 160 using an evaporation, electrolytic plating, electroless plating, ball drop, or screen printing process. Bump material 222 can be Al, Sn, Ni, Au, Ag, Pb, Bi, Cu, solder, and combinations thereof, with an optional flux solution. For example, the bump material can be eutectic Sn/Pb, high-lead solder, or lead-free solder. Bump material 222 is bonded to contact pads 172 using a suitable attachment or bonding process. In one embodiment, the bump material is reflowed by heating the material above its melting point to form spherical balls or bumps 222. In some applications, bumps 222 are reflowed a second time to improve electrical contact to contact pads 172. In one embodiment, bumps 222 are formed over a UBM having a wetting layer, barrier layer, and adhesive layer. The bumps can also be compression bonded or thermocompression bonded to contact pads 172. Bumps 222 represent one type of interconnect structure that can be formed over contact pads 172. The interconnect structure can also use bond wires, conductive paste, stud bump, micro bump, or other electrical interconnect.

Figure 9E:
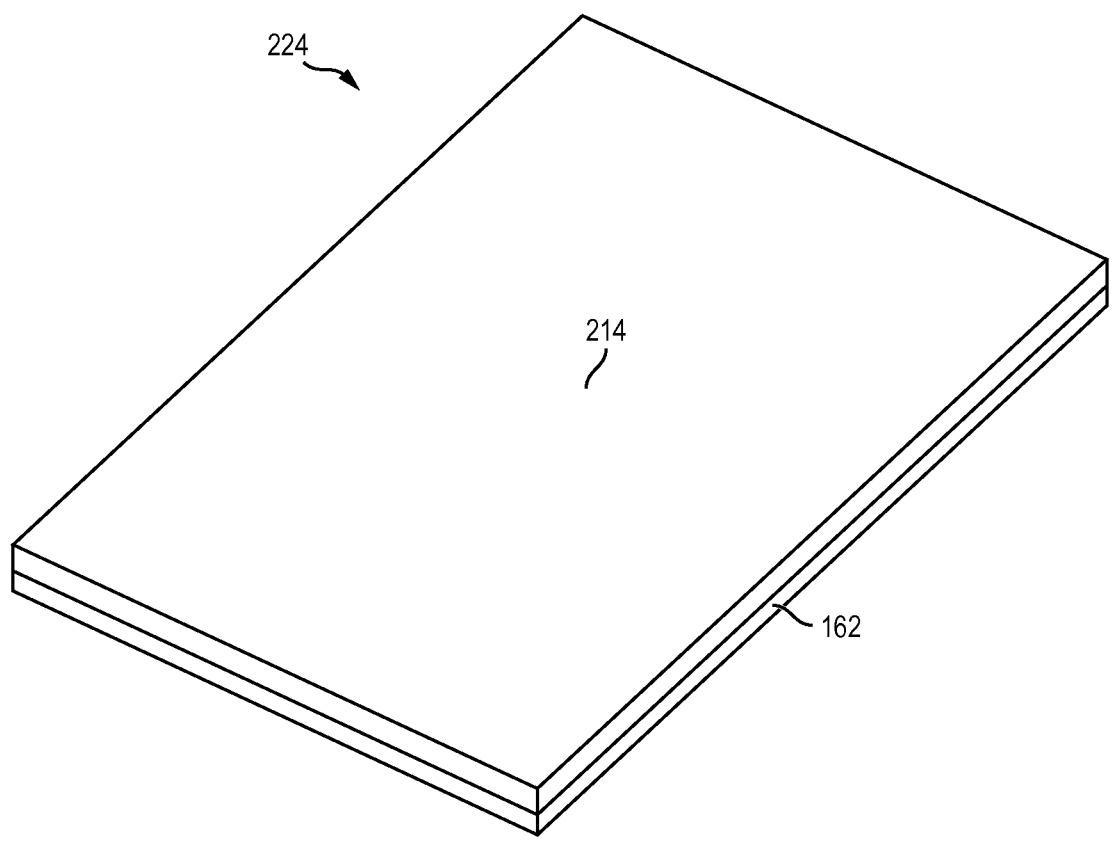

FIG. 9e illustrates a top view of the embedded sensor die package 224. Semiconductor die 124 with sensor area 131 is disposed on die-attach area 166 and embedded on substrate 160. Conductive posts 164 are disposed around semiconductor die 124. Wirebonds 176 electrically connect semiconductor die 124 to conductive posts 164 at contact pads 170 and wirebonds 176 are embedded within penetrable adhesive layer 214 and encapsulant 218 to preserve electrical connectivity. Semiconductor die 124 and sensor area 131 are protected by encapsulant 218 and penetrable adhesive layer 214. One portion of conductive posts 164 are electrically connected to substrate 160 and another portion of conductive posts 164 are electrically isolated from substrate 160. The surface of sensor die package 224 is covered by penetrable adhesive layer 214. Sacrificial cap layer 216 is easily and delicately removed in order to reduce damage to sensor area 131. Sensor die package 224 protects the sensitive active surface 130 with sensor area 131 while providing interconnection to other system components.

Sensor die package 224 protects semiconductor die 124 with sensor area 131 by embedding semiconductor die 124 at the base 162 of substrate 160. Conductive posts 164 disposed around semiconductor die 124 provide additional protection, structural support for the sensor die package 224, and higher density electrical connections. Sensor die package 224 has a reduced footprint with maximized protection to semiconductor die 124. Electrically isolating one or more conductive posts 164 provides greater flexibility for connecting sensor die package 224 to additional semiconductor components.

Penetrable adhesive layer 214 can provide multiple advantages. Penetrable adhesive layer 214 can serve as a protective layer for sensor area 131 during packaging. Penetrable adhesive layer 214 can also delicately adhere components over the sensitive sensor die area 131. Applying heat or elevated temperatures to the sensor die package 224 can reduce the adhesive properties of penetrable adhesive layer 214. As a result, the layer can be manipulated or repositioned on the sensor die package 224 according to its intended purpose with reduced harmful exposure to sensor area 131. In addition, using penetrable adhesive layer 214, sacrificial cap layer 216 or other semiconductor components can be carefully attached to and delicately removed from sensor die package 224 while significantly minimizing damage to sensor area 131 and active surface 130.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
   providing a substrate including a base and a plurality of conductive posts extending from the base;
   forming a contact pad over a surface of a first conductive post of the plurality of conductive posts;
   providing a semiconductor die including a sensor area;
   disposing the semiconductor die over the base between the conductive posts with a back surface of the semiconductor die opposite an active surface of the semiconductor die disposed below the contact pad;
   forming an interconnect structure between the semiconductor die and the first conductive post;
   disposing a penetrable adhesive layer over the semiconductor die and sensor area with a portion of the interconnect structure embedded within the penetrable adhesive layer;
   disposing a sacrificial layer over the penetrable adhesive layer;
   depositing an encapsulant around the semiconductor die and conductive posts with a surface of the encapsulant coplanar with a surface of the sacrificial layer; and
   removing the sacrificial layer while leaving the penetrable adhesive layer over the semiconductor die and sensor area.

2. The method of claim 1, further including removing a portion of the substrate to isolate at least one of the conductive posts.

3. The method of claim 1, further including heating the penetrable adhesive layer to facilitate removing the sacrificial layer.

4. The method of claim 1, wherein the substrate is a wafer-shape, panel, or singulated form.

5. A method of making a semiconductor device, comprising:
provniding a substrate including a base and a plurality of conductive posts extending from the base;
disposing a semiconductor die including a sensor area over the base between the conductive posts with a back surface of the semiconductor die disposed below a surface of a first conductive post of the plurality of conductive posts;
forming an interconnect structure between the semiconductor die and conductive posts;
disposing a penetrable adhesive layer in contact with the sensor area of the semiconductor die with a portion of the interconnect structure embedded within the penetrable adhesive layer; and
depositing an encapsulant around the semiconductor die and conductive posts.

6. The method of claim 5, further including disposing a sacrificial layer over the penetrable adhesive layer.

7. The method of claim 5, wherein the conductive posts include a circular, rectangular, tapered, or narrowing intermediate shape.

8. The method of claim 5, further including removing a portion of the substrate to electrically isolate one or more of the conductive posts.

9. A semiconductor device, comprising:
a substrate including a base and a plurality of conductive posts extending from the base;
a semiconductor die including a sensor area disposed over the base between the conductive posts;
an interconnect structure formed between the semiconductor die and conductive posts;
a penetrable adhesive layer disposed in contact with the sensor area and terminating within a footprint of the semiconductor die; and
an encapsulant deposited around the semiconductor die and conductive posts.

10. The semiconductor device of claim 9, wherein at least one of the conductive posts is electrically isolated.

11. The semiconductor device of claim 9, further including a sacrificial layer formed over the penetrable adhesive layer.

12. The semiconductor device of claim 9, wherein the conductive posts include a circular, rectangular, tapered, or narrowing intermediate shape.

13. A semiconductor device, comprising:
a substrate including a base and a plurality of conductive posts extending from the base;
a semiconductor die disposed over the base between the conductive posts; and
a penetrable adhesive layer disposed in contact with the semiconductor die;
a sacrificial layer disposed in contact with the penetrable adhesive layer; and
an encapsulant deposited around the semiconductor die and conductive posts with a surface of the encapsulant coplanar with a surface of the sacrificial layer.

14. The semiconductor device of claim 13, wherein the penetrable adhesive layer includes a thermal release film material.

15. The semiconductor device of claim 13, further including:
an interconnect structure formed between the semiconductor die and conductive posts, wherein a portion of the interconnect structure is embedded within the penetrable adhesive layer.

16. The semiconductor device of claim 13, wherein the sacrificial layer includes a conductive material.

17. The semiconductor device of claim 13, wherein the conductive posts include a circular, rectangular, tapered, or narrowing intermediate shape.

18. The method of claim 1, further including removing the penetrable adhesive layer over the sensor area.

19. The method of claim 6, wherein the sacrificial layer includes a conductive material.

20. The method of claim 6, further including removing the sacrificial layer.

21. The method of claim 5, further including removing the penetrable adhesive layer over the sensor area.

22. The semiconductor device of claim 9, wherein the penetrable adhesive layer includes a thermal release film material.

23. The method of claim 1, wherein the interconnect structure includes a bond wire.

24. The method of claim 5, wherein the interconnect structure includes a bond wire.

25. The semiconductor device of claim 5, wherein a surface of the encapsulant is coplanar with a surface of the sacrificial layer.

26. The semiconductor device of claim 9, wherein the interconnect structure includes a bond wire.

27. The semiconductor device of claim 9, wherein a surface of the encapsulant is coplanar with a surface of the sacrificial layer.

28. A method of making a semiconductor device, comprising:
providing a substrate including a base and a plurality of conductive posts extending from the base;
disposing a semiconductor die including a sensor area over the base between the conductive posts;
forming a bond wire between the semiconductor die and conductive posts;
disposing a penetrable adhesive layer in contact with the sensor area of the semiconductor die;
disposing a sacrificial layer over the penetrable adhesive layer;
depositing an encapsulant around the semiconductor die and conductive posts; and
removing the sacrificial layer while leaving the penetrable adhesive layer over the semiconductor die and sensor area.

29. The method of claim 28, wherein a portion of the bond wire is embedded within the penetrable adhesive layer.

30. The method of claim 28, wherein a surface of the encapsulant is coplanar with a surface of the sacrificial layer.

31. The method of claim 28, wherein the sacrificial layer includes a conductive material.

32. The method of claim 28, further including removing a portion of the substrate to electrically isolate the conductive posts.

33. The method of claim 28, further including removing the penetrable adhesive layer over the sensor area.

34. The semiconductor device of claim 28, wherein the penetrable adhesive layer includes a thermal release film material.

* * * * *